(12) United States Patent
Aoyama et al.

(10) Patent No.: US 11,211,195 B2
(45) Date of Patent: Dec. 28, 2021

(54) NOISE CURRENT ABSORBER

(71) Applicant: KITAGAWA INDUSTRIES CO., LTD., Aichi (JP)

(72) Inventors: Hiroshi Aoyama, Aichi (JP); Hideharu Kawai, Aichi (JP)

(73) Assignee: Kitagawa Industries Co., Ltd., Aichi (JP)

( * ) Notice: Subject to any disclaimer, the term of this patent is extended or adjusted under 35 U.S.C. 154(b) by 353 days.

(21) Appl. No.: 16/348,999

(22) PCT Filed: Nov. 2, 2017

(86) PCT No.: PCT/JP2017/039833
§ 371 (c)(1),
(2) Date: May 10, 2019

(87) PCT Pub. No.: WO2018/088337
PCT Pub. Date: May 17, 2018

(65) Prior Publication Data
US 2019/0287717 A1    Sep. 19, 2019

(30) Foreign Application Priority Data

Nov. 11, 2016 (JP) .............................. JP2016-220698

(51) Int. Cl.
*H01F 27/33* (2006.01)
*H01F 17/06* (2006.01)
(Continued)

(52) U.S. Cl.
CPC ............. *H01F 27/33* (2013.01); *H01F 17/06* (2013.01); *H01F 27/02* (2013.01); *H01F 27/266* (2013.01);
(Continued)

(58) Field of Classification Search
CPC .......... H01F 27/33; H01F 17/06; H01F 27/02; H01F 27/266; H01F 2017/065; H05K 5/0221; H05K 9/00
See application file for complete search history.

(56) References Cited

U.S. PATENT DOCUMENTS 5,355,109 A * 10/1994 Yamazaki ............... H01F 17/06
174/664
5,486,803 A * 1/1996 Igarashi .................. H01F 17/06
333/12
(Continued)

FOREIGN PATENT DOCUMENTS

| CN | 1112381 A | 11/1995 |
| DE | 4201926 | 8/1992 |

(Continued)

OTHER PUBLICATIONS

Form PCT/ISA/210 (International Search Report) for International application No. PCT/JP2017/039833.
(Continued)

*Primary Examiner* — Tuyen T Nguyen
(74) *Attorney, Agent, or Firm* — Renner, Otto, Boisselle & Sklar LLP

(57) ABSTRACT

A noise current absorber includes a pair of split magnetic bodies formed by equally splitting an annular magnetic body into an open annular shape, and a pair of housing parts capable of housing the split magnetic bodies. The pair of housing parts are coupled, and thus the pair of split magnetic bodies are abutted into an annular shape. The pair of housing parts include a first spring and a pair of second springs. The first spring is disposed in a central region of a bottom surface of the housing part facing the split magnetic body. The pair of second springs are disposed on both sides of the first spring.

6 Claims, 6 Drawing Sheets

(51) Int. Cl.
*H01F 27/02* (2006.01)
*H01F 27/26* (2006.01)
*H05K 5/02* (2006.01)
*H05K 9/00* (2006.01)

(52) U.S. Cl.
CPC ............ *H05K 5/0221* (2013.01); *H05K 9/00* (2013.01); *H01F 2017/065* (2013.01)

(56) References Cited

U.S. PATENT DOCUMENTS

| | | | |
|---|---|---|---|
| 5,703,557 A | 12/1997 | Osada et al. | |
| 5,942,964 A * | 8/1999 | Takeuchi | H03H 1/0007 336/92 |
| 7,319,376 B2 * | 1/2008 | Kobayashi | H01F 17/06 336/175 |
| 2002/0024402 A1 | 2/2002 | Morita et al. | |
| 2007/0120635 A1 | 5/2007 | Kobayashi et al. | |
| 2016/0135310 A1 | 5/2016 | Kawai | |

FOREIGN PATENT DOCUMENTS

| | | | |
|---|---|---|---|
| EP | 3018666 A2 | 5/2016 | |
| JP | 05093012 U | 12/1993 | |
| JP | H07122433 A | 5/1995 | |
| JP | 2000091136 A | 3/2000 | |
| JP | 2001326123 A | 11/2001 | |
| JP | 2008-21702 A | 1/2008 | |
| JP | 2008021702 A | 1/2008 | |
| JP | 2016-92274 A | 5/2016 | |
| JP | 2016092274 A | 5/2016 | |

OTHER PUBLICATIONS

Extended European Search Report issued by EUIPO for corresponding European patent application No. 17870235.3 dated Jun. 9, 2020.
Chinese First Office Action issued by CNIPA for corrresponding Chinese patent application No. 201780069778.X dated Jul. 1, 2020.
Notice of Reasons for Refusal for corresponding Japanese patent application No. 2016-220698 dated May 12, 2020.
International Preliminary Report on Patentability (IPRP) for International application No. PCT/JP2017/039833 dated May 23, 2019.
Written Opinion of the ISA for International application No. PCT/JP2017/039833 dated Feb. 6, 2018.
The specification and drawings annexed to the request of Japanese Utility Model Application No. 74308/1992 (Laid-open No. 93012 / 1993) (Tokin Corp.) Dec. 7, 1993, paragraph [0009], fig. 2 (Family: none).

\* cited by examiner

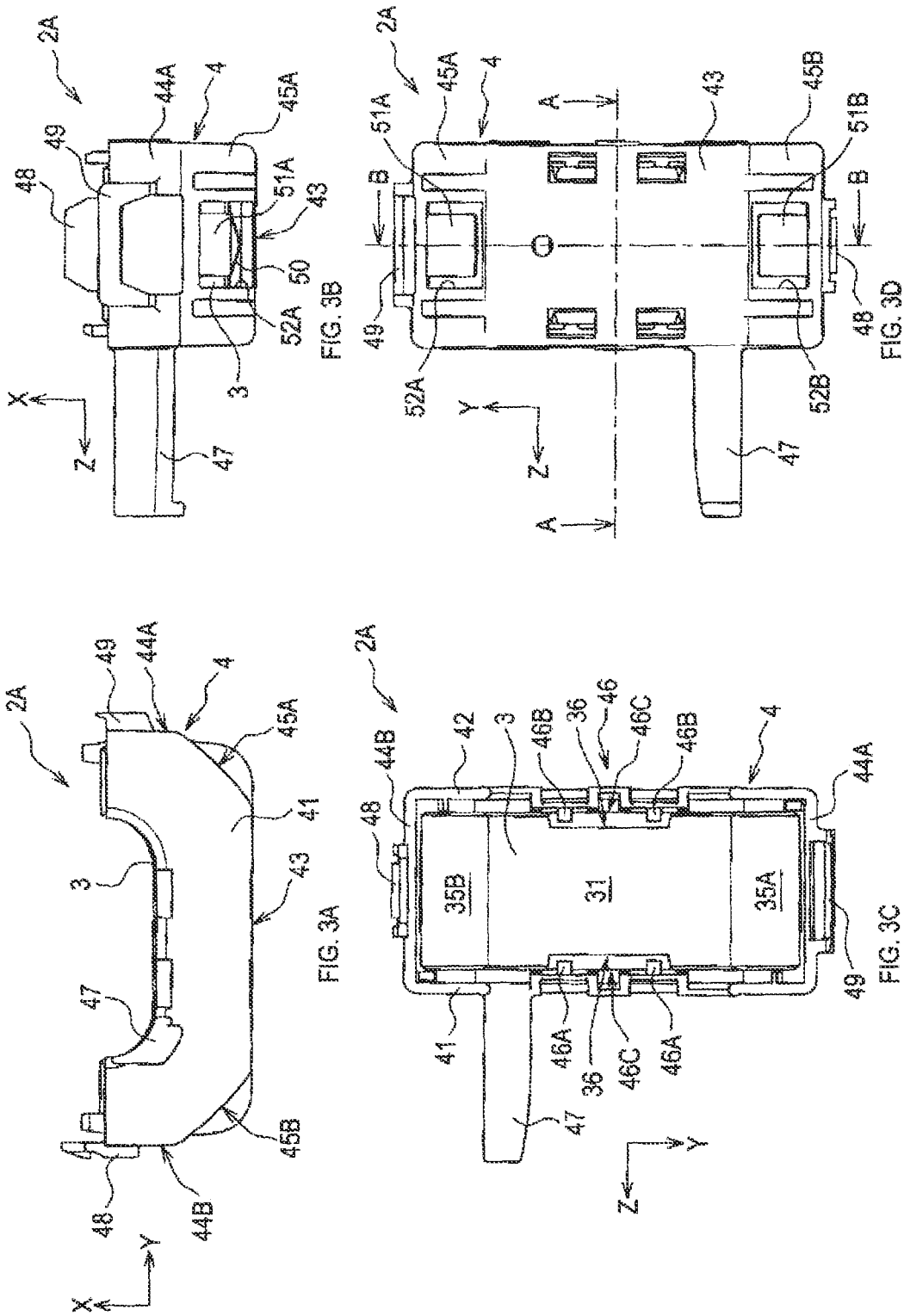

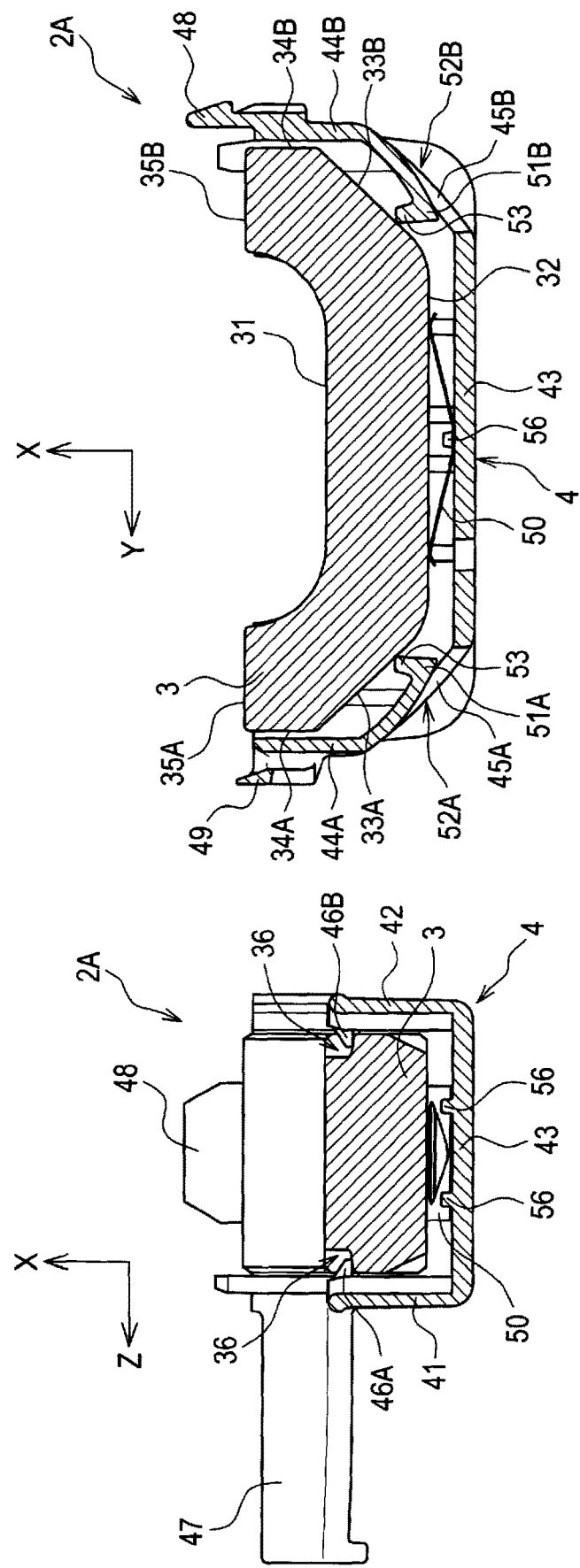

NOISE CURRENT ABSORBER

TECHNICAL FIELD

The present disclosure relates to a noise current absorber.

BACKGROUND ART

Noise current absorbers are known as a part that absorbs a noise current flowing in an electric wire or wiring harness. Such a noise current absorber absorbs a noise current with an annular magnetic body having a center hole (called a magnetic core). This annular magnetic body is formed by winding an electric wire which alternately comes in contact with the outer circumferential surface and the center hole of the annular magnetic body.

With such a noise current absorber, a configuration is known in which two split magnetic bodies are housed in respective housing parts that are abutted each other, thereby abutting the split magnetic bodies (refer to Patent Document 1).

CITATION LIST

Patent Literature

Patent Document 1: Japanese Unexamined Patent Application Publication No. 2016-92274A

SUMMARY OF INVENTION

Technical Problem

With the above-described split-type noise current absorber, reliably abutting the split magnetic bodies is required. Therefore, in Patent Document 1, a metal spring that biases the magnetic body in the abutting direction is provided on the bottom surface of the housing part.

However, when the diameter of the magnetic body increases, with the configuration of Patent Document 1, the magnetic body is easily off aligned in a direction perpendicular to the abutting direction, or the magnetic body easily inclines with respect to the abutting surface. As a result, the absorption characteristics (i.e., the impedance characteristics) of the noise current may decrease.

In an aspect of the present disclosure, an object is to provide a noise current absorber capable of stably holding split magnetic bodies in an abutted state.

Solution to Problem

According to an aspect of the present disclosure, a noise current absorber includes a pair of split magnetic bodies formed by equally splitting a magnetic body in an annular shape into an open annular shape and a pair of housing parts capable of housing the split magnetic bodies. With the noise current absorber, the pair of housing parts are coupled to abut the pair of split magnetic bodies each other into the annular shape. The pair of housing parts each have a plurality of springs configured to abut an outer circumferential surface of each of the split magnetic bodies and bias each of the split magnetic bodies in a first direction parallel to the coupling direction of the pair of housing parts. The plurality of springs include a first spring made of metal and a pair of second strings made of resin, the first spring being disposed in a central region of a bottom surface of the housing part facing the split magnetic bodies, the pair of second springs being disposed on both sides of the first spring in a second direction perpendicular to both the first direction and a central axis direction of the annular magnetic body formed by abutting the pair of split magnetic bodies.

According to such a configuration, the split magnetic body can be biased in the first direction by the first spring made of metal. The split magnetic body can also be biased in the first direction and the second direction by the second springs made of resin. Therefore, the displacement of the split magnetic body in the second direction or inclination with respect to an abutting surface can be prevented. Metal springs have a higher natural frequency in comparison with resin springs in an equivalent shape. On the other hand, as for the vibration generated in the split magnetic body housed in the coupled housing part, a vibration in the first direction typically has a smaller frequency in comparison with a vibration in the second direction. Therefore, by receiving the vibration in the first direction by the first spring made of metal and receiving the vibration in the second direction by the second springs made of resin, the resonance of these springs can be avoided, and the magnification of vibration can be suppressed.

According to an aspect of the present disclosure, the abutting surface of the pair of second springs in each of the split magnetic bodies may be a plane inclined with respect to the first direction and the second direction. The pair of second springs may each have a plate-like portion provided protruding from an internal surface toward the bottom surface of the housing part. Furthermore, in a state in which the split magnetic bodies are not housed, a tip of the plate-like portion may be closer to a center of the housing part than the internal surface. According to such a configuration, the ratio of the amount of the deformation of the second springs of the split magnetic body with respect to the amount of pressing can be decreased as the amount of pressing on the second springs increases. As a result, even when the size of the split magnetic body is large, the creep and breakage of the second springs can be prevented.

According to an aspect of the present disclosure, the pair of housing parts may each have a through hole through which a position of the first spring can be visually recognized from the outside before a coupling. In addition, the through hole may be at least partially blocked by one of the second springs upon the coupling of the pair of housing parts. According to such a configuration, it is possible to visually check whether the first spring is disposed in the correct position after the split magnetic body is housed. In addition, because the through hole is blocked after the coupling of the housing parts, the first spring is prevented from falling out of the through hole.

According to an aspect of the present disclosure, the pair of housing parts may each include a holding portion configured to regulate a movement of the split magnetic bodies in the first direction. In addition, the holding portion may include four claw portions configured to engage with the inner circumferential surface of each of the split magnetic bodies and sandwich each of the split magnetic bodies from both sides in the central axis direction of the annular magnetic body. Furthermore, two first claw portions of the four claw portions may be disposed separated from each other in a circumferential direction and disposed on one side of each of the split magnetic bodies in the central axis direction of the annular magnetic body. Still furthermore, two second claw portions of the four claw portions different from the first claw portions may be disposed on the other side of each of the split magnetic bodies in the central axis direction of the annular magnetic body while facing the two first claw portions, respectively. According to such a configuration, the split magnetic body can be appropriately prevented from falling out of the housing part before the coupling of the housing parts. In addition, by inserting a tool between the two first claw portions or the two second claw portions, the split magnetic body can be easily removed from the housing part.

BRIEF DESCRIPTION OF DRAWINGS

FIG. 3A is a schematic front view of the coupling module of FIG. 2,

FIG. 3B is a schematic side view of the coupling module of FIG. 2,

FIG. 3C is a schematic plan view of the coupling module of FIG. 2, and

FIG. 3D is a schematic bottom view of the coupling module of FIG. 2.

FIG. 4A is a schematic cross-sectional view taken along line A-A of FIG. 3D, and FIG. 4B is a schematic cross-sectional view taken along line B-B of FIG. 3D.

DESCRIPTION OF EMBODIMENTS

Embodiments to which the present disclosure has been applied will be described below with reference to the drawings.

1. First Embodiment 1-1. Configuration

Figure 1:
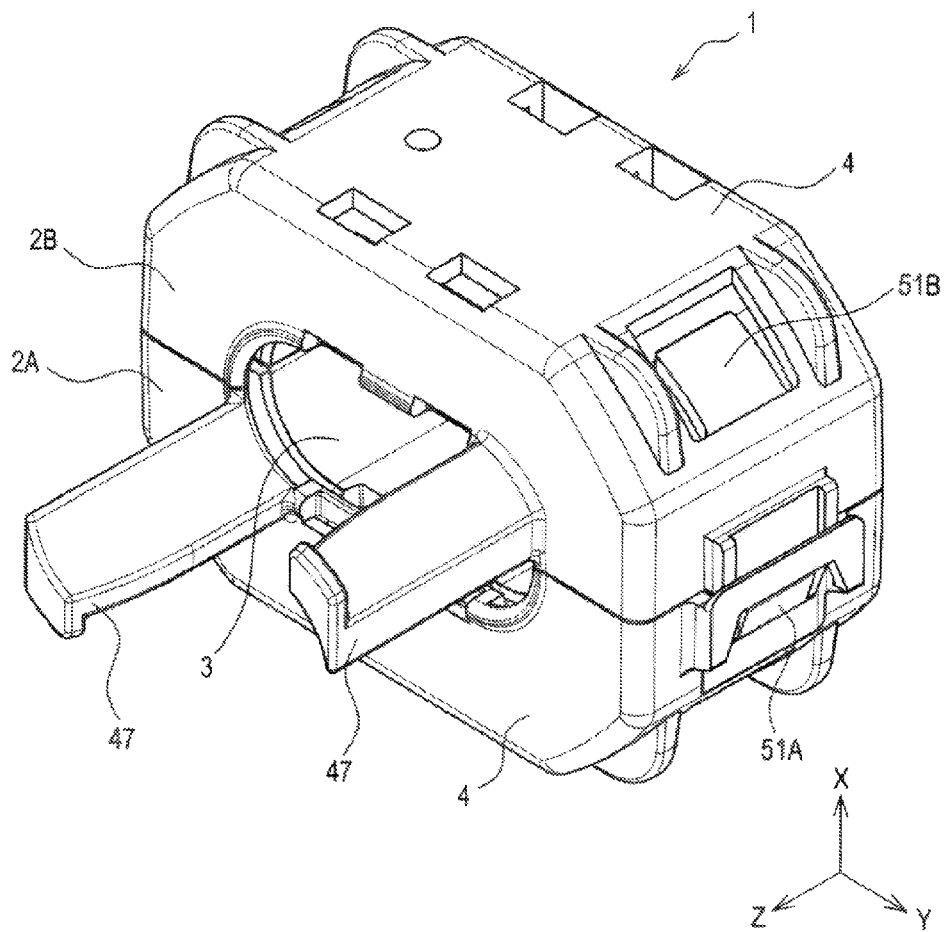
FIG. 1 is a schematic perspective view of a noise current absorber of an embodiment.

A noise current absorber 1 illustrated in FIG. 1 is formed by covering an annular magnetic body with a case. The noise current absorber 1 is configured by coupling a pair of coupling modules 2A and 2B. The pair of coupling modules 2A and 2B are identical. Therefore, the coupling module 2A of these will be described below.

As illustrated in FIG. 2, FIGS. 3A, 3B, 3C, and 3D, FIGS. 4A and 4B, the coupling module 2A includes a split magnetic body 3 and a housing part 4. The split magnetic body 3 is formed by equally splitting a magnetic body in an annular shape into an open annular shape. The housing part 4 is capable of housing the split magnetic body 3. The coupling module 2B is coupled to the coupling module 2A in a first direction (X-axis direction in the drawing) while rotating the coupling module 2B by 180° about a central axis of an annular magnetic body. This magnetic body (hereinafter, also referred to as "annular magnetic body") is formed by abutting a pair of the split magnetic bodies 3. In this way, the noise current absorber 1 is obtained. As such, the noise current absorber 1, obtained by coupling the coupling module 2A to the coupling module 2B, includes the pair of the split magnetic bodies 3 and a pair of the housing parts 4.

Split Magnetic Body

The split magnetic bodies 3 are formed by equally splitting a magnetic body in an annular shape into two parts in a virtual plane that includes the central axis of the magnetic body. The split magnetic bodies 3 are formed by coupling the pair of housing parts 4 (that is, a coupling of the pair of coupling modules 2A and 2B) and abutting split surfaces together. In this way, an annular magnetic body is formed.

The type of the magnetic body is not particularly limited. Examples of the magnetic body include a green compact, a sintered body, or the like made of using ferrite or amorphous metal as a raw material. Note that the tolerance of such a magnetic body made of metal is relatively large.

In the present embodiment, the split magnetic body 3 is formed by splitting a magnetic body in an elliptical annular shape. As illustrated in FIG. 4B, in an inner circumferential surface 31 of the split magnetic body 3, the center portion in a second direction (Y-axis direction in the drawing) perpendicular to both the first direction and the central axis direction of the annular magnetic body is a plane. The both end sections on the plane excluding the center portion are curved surfaces.

As illustrated in FIG. 3C, grooves 36 for engaging a holding portion 46 of the housing part 4 are each formed along the Y-axis direction on both ends of the planar portion of the inner circumferential surface 31 in a direction parallel to the central axis of the annular magnetic body (the Z-axis direction in the drawing).

As illustrated in FIG. 4B, the outer circumferential surface of the split magnetic body 3 is formed with a bottom surface 32, a pair of abutting surfaces 33A and 33B, and a pair of side surfaces 34A and 34B. The bottom surface 32 is a plane located on the center portion in the Y-axis direction. The pair of abutting surfaces 33A and 33B are planes continuous with the both ends of the bottom surface 32 in the Y-axis direction and abutting a pair of second springs 51A and 51B, respectively. The pair of side surfaces 34A and 34B are continuous with the pair of abutting surfaces 33A and 33B, respectively, and extending in the X-axis direction.

A pair of split surfaces 35A and 35B of the split magnetic body 3 are planes each parallel to the bottom surface 32. When the coupling module 2A is coupled, the split surfaces 35A and 35B serve as the abutting surface of the split magnetic body 3.

Housing Part

Figure 2:
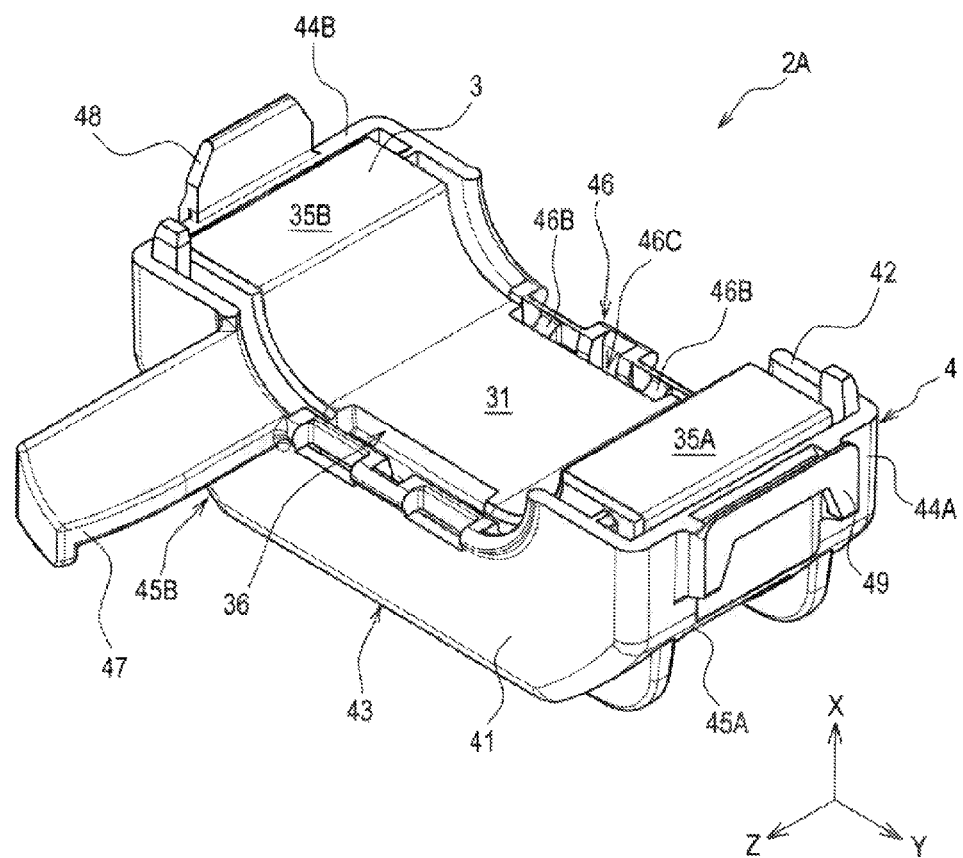
FIG. 2 is a schematic perspective view of one of coupling modules of the noise current absorber of FIG. 1.

The housing part 4 is a resin case having a space capable of housing the split magnetic body 3. As illustrated in FIG. 2 and the like, the housing part 4 includes a front wall 41 and a rear wall 42, a bottom wall 43, a pair of side walls 44A and 44B, and a pair of inclined walls 45A and 45B. The front wall 41 and the rear wall 42 face each other in the Z-axis direction. The bottom wall 43 forms the bottom surface of the housing part 4 perpendicular to the X axis. The pair of side walls 44A and 44B face each other in the Y-axis direction. The pair of inclined walls 45A and 45B connect the bottom wall 43 and the side wall 44A and connect the bottom wall 43 and the side wall 44B, respectively. The split magnetic body 3 is housed in an internal space defined by these walls.

Overall Configuration of Housing Part

The front wall 41 and the rear wall 42 are provided perpendicular to the Z axis and regulate a movement of the split magnetic body 3 in the Z-axis direction. As illustrated in FIG. 3C, on an end portion of the front wall 41 and the rear wall 42 opposite from the bottom surface of the housing part 4, a first claw portion 46A or a second claw portion 46B of the holding portion 46 is provided. The first claw portion 46A and the second claw portion 46B each engage with the grooves 36 of the split magnetic body 3.

In addition, on the front wall 41, a drawing piece 47 for securing a wire is provided. The drawing piece 47 protrudes in the Z-axis direction from or from around the center hole of the noise current absorber 1. An electric wire is inserted through the center hole of the noise current absorber 1 and fixed to the drawing piece 47 by binding, for example, with a tape or bands.

The pair of side walls 44A and 44B are provided perpendicular to the Y axis and regulate a movement of the split magnetic body 3 in the Y-axis direction. The pair of side walls 44A and 44B are each provided with a part for locking the coupling of the housing parts 4. Specifically, a protruding portion 48 is provided to one of the pair of side walls 44A and 44B (the side wall 44B in the drawing), and an engagement portion 49 is provided to the other side wall (side wall 44A in the drawing). The engagement portion 49 can be engaged with the protruding portion 48.

As illustrated in FIG. 4B, the bottom wall 43 is provided perpendicular to the X axis and regulates a movement of the split magnetic body 3 in the X-axis direction. In the middle of the internal surface of the bottom wall 43 (that is, the bottom surface of the housing part 4) in the Y-axis direction, a metal first spring 50 is mounted.

The pair of inclined walls 45A and 45B are provided substantially parallel to the abutting surfaces 33A and 33B of the split magnetic body 3, respectively. One inclined wall 45A (45B) is provided with one second spring 51A (51B). One inclined wall 45A (45B) also has one through hole 52A (52B) formed in a region surrounding the second spring 51A (51B).

Spring

The housing part 4 has a plurality of springs that abut the outer circumferential surface of the split magnetic body 3 and bias the split magnetic body 3 in the X-axis direction. In the present embodiment, as illustrated in FIG. 4B, the housing part 4 includes the first spring 50 made of metal and the pair of second springs 51A and 51B made of resin. The first spring 50 is disposed in a central region of the bottom surface of the housing part 4 facing the split magnetic body 3. The pair of second springs 51A and 51B are disposed on both sides of the first spring 50 in the Y-axis direction.

The first spring 50 is a plate spring formed by bending a metal plate. The first spring 50 has a shape that is symmetrical with respect to the X-Z plane that passes through the central axis of the annular magnetic body. Specifically, as illustrated in FIG. 4B, the first spring 50 has a V-shape in a Z-axis view (X-Y cross-section). The center portion (that is, a portion corresponding to a V-shape bending point) is locked to the bottom wall 43 of the housing part 4 as a fixed end, and both ends abut the split magnetic body 3 as free ends. That is, the first spring 50 supports the split magnetic body 3 at two points in the Y-axis direction and biases the split magnetic body 3 in the X-axis direction. Note that the both ends of the first spring 50 are each further bent toward the bottom wall 43 and abut the split magnetic body 3 at these bending points.

Note that the first spring 50 is not completely fixed to the housing part 4. The first spring 50 is held in position by being sandwiched between the bottom wall 43 and the split magnetic body 3. The first spring 50 has a through hole in the center portion and is positioned by inserting the through hole into a projection 56 provided in the bottom wall 43. The position of the first spring 50 after housing of the split magnetic body 3 can be confirmed from at least one of a pair of through holes 52A and 52B.

As illustrated in FIG. 4B, the pair of second springs 51A and 51B each include a plate-like body and a protrusion 53. The plate-like body is provided protruding from an internal surface of the housing part 4 toward a bottom surface of the housing part 4 facing the split magnetic body 3. The protrusion 53 protrudes from the tip of the body toward the split magnetic body 3. The pair of second springs 51A and 51B are each abutted against a pair of abutting surfaces 33A and 33B of the split magnetic body 3 at the protrusions 53. The pair of second springs 51A and 51B have a symmetrical shape with respect to the X-Z plane that passes through the central axis of the annular magnetic body.

The body of one second spring 51A (51B) is a tongue-like plate material in which a portion of one inclined wall 45A (45B) is cut and raised inward of the housing part 4. Specifically, the body of the second spring 51A (51B) is cut and raised by a fulcrum provided on the inclined wall 45A (45B), extended from this fulcrum toward the bottom wall 43, and integrally formed with inclined wall 45A (45B).

With the housing part 4 not housing the split magnetic body 3, the body of the pair of second springs 51A and 51B approach the center of the housing part 4 as the body of the pair of second springs 51A and 51B approach toward the center side of the housing part 4 in the Y-axis direction (that is, toward the first spring 50 side). That is, as illustrated in FIG. 4B, the tips of the pair of second springs 51A and 51B are each raised from the pair of inclined walls 45A and 45B as seen from the Z-axis and are closer to the center of the housing part 4 than the pair of inclined walls 45A and 45B.

More specifically, in Z-axis view (X-Y cross section), the acute angle formed between the tangent line of the internal surface of the main body of the second spring 51A (51B) (that is, the surface on the split magnetic body 3 side) and the Y axis is decreased toward the center side of the housing part 4. Furthermore, the acute angle formed between the tangent line and the Y axis is smaller than an acute angle formed between the abutting surface 33A (33B) of the split magnetic body 3 and the Y axis.

The split magnetic body 3 is elastically supported at four points by the first spring 50 and the pair of second springs 51A and 51B. In addition, the first spring 50 and the pair of second springs 51A and 51B do not differ from each other greatly in the length and width of the elastic deformation region. That is, these springs have a relatively similar shape to each other. Therefore, the first spring 50 made of metal has a higher natural frequency than the pair of second springs 51A and 51B made of resin.

Through Hole

As illustrated in FIG. 3D, the housing part 4 has the pair of through holes 52A and 52B formed in the pair of inclined walls 45A and 45B, respectively. The pair of through holes 52A and 52B each enclose one second spring 51A (51B). In other words, one second spring 51A (51B) is formed by one through hole 52A (52B) separating a portion of the pair of inclined walls 45A and 45B from the body portion.

As illustrated in FIG. 3B, the pair of through holes 52A and 52B function as a viewing window through which the state of the first spring 50 can be visually recognized from the Y-axis direction in a state in which the split magnetic body 3 is housed in the housing part 4. When the pair of coupling modules 2A and 2B are coupled each other, the pair of second springs 51A and 51B are deformed and pushed outward by press of the split magnetic body 3. As a result, as illustrated in FIG. 1, the pair of through holes 52A and 52B are at least partially blocked by the pair of second springs 51A and 51B, respectively.

Holding Portion

The housing part 4 has the holding portion 46 configured to regulate the movement of the split magnetic body 3 in the X-axis direction. As illustrated in FIG. 3C, the holding portion 46 includes four claw portions 46A and 46B that engage with the groove 36 in the inner circumferential surface 31 of the split magnetic body 3 and sandwich the split magnetic body 3 from both sides in the central axis direction of the annular magnetic body.

Of the four claw portions 46A and 46B, two first claw portions 46A are disposed on one side of the split magnetic body 3 in the Z-axis direction. Specifically, the two first claw portions 46A are provided at the end of the front wall 41 in the X-axis direction. Two second claw portions 46B different from the first claw portions 46A are disposed on the other side of the split magnetic body 3 in the Z-axis direction while facing the two first claw portions 46A, respectively. Specifically, the two second claw portions 46B are provided on the end portion of the rear wall 42 in the X-axis direction at positions facing the two first claw portions 46A in the Z-axis direction.

A tip of each of the claw portions protrudes from the front wall 41 or the rear wall 42 inward in the Z-axis direction. This tip engages with the groove 36 of the split magnetic body 3. This configuration prevents the split magnetic body 3 from jumping out in the X-axis direction.

The two first claw portions 46A provided on the front wall 41 are disposed separated from each other in the circumferential direction or the Y-axis direction of the split magnetic body 3. Similarly, the two second claw portions 46B provided on the rear wall 42 are also disposed separated from each other in the Y-axis direction. Accordingly, between the two first claw portions 46A and between the two second claw portions 46B, a cavity 46C into which a tool can be inserted is formed.

Amount of Deformation of Second Spring

The following describes the amount of the deformation of the second springs 51A and 51B of the present embodiment with respect to the amount of pressing using specific examples.

As described above, the pair of second springs 51A and 51B extend from the internal surface of the housing part 4 toward the bottom surface of the housing part 4. In addition, the pair of second springs 51A and 51B are each curved into a protrusion shape in the radial direction of the split magnetic body 3 and outward of the housing part 4. As a result, the ratio of the amount of the deformation of the spring to the amount of pressing in the X-axis direction can be reduced.

Figure 5A:
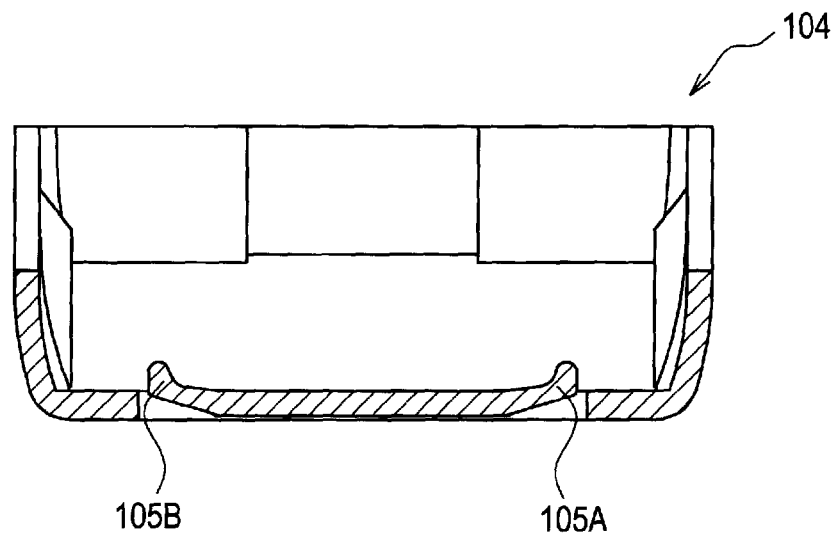
FIG. 5A is a schematic cross-sectional view of a housing part of Comparative Example 1.
Figure 5B:
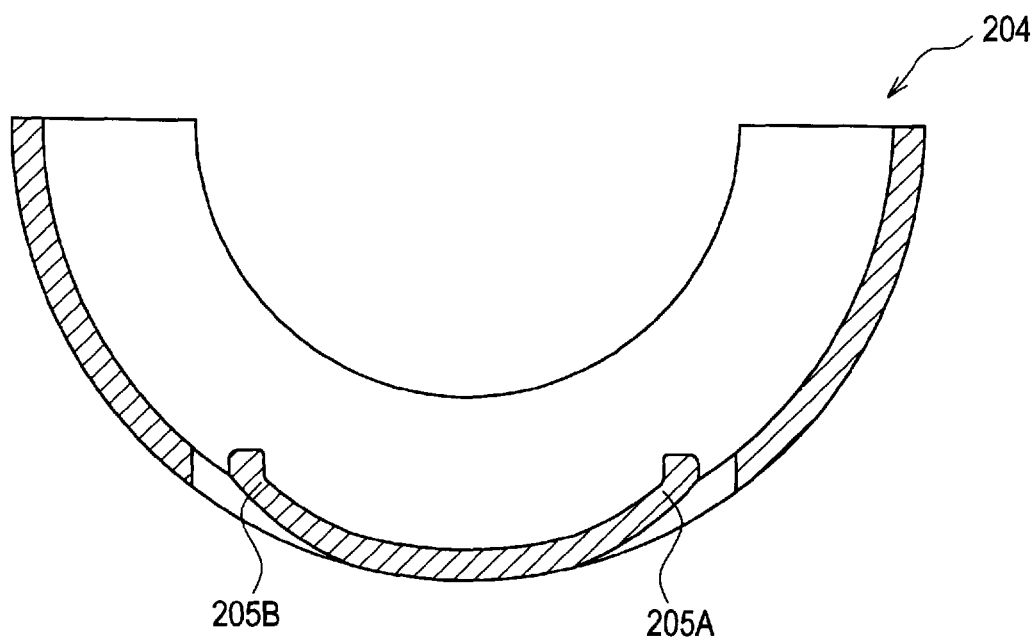
FIG. 5B is a schematic cross-sectional view of a housing part of Comparative Example 2.

In relation to this effect, a pair of resin springs 105A and 105B of a housing part 104 illustrated in FIG. 5A and a pair of resin springs 205A and 205B of a housing part 204 illustrated in FIG. 5B were used as comparative examples. The amount of the deformation of the respective resin springs described above was compared with that of the resin springs of the present embodiment (that is, the second springs 51A and 51B). The housing part 104 in FIG. 5A has the pair of resin springs 105A and 105B that extend laterally and upward from the center of the planar bottom surface. The housing part 204 in FIG. 5B has the pair of resin springs 205A and 205B that extend laterally and upward from the center of the bottom surface curved along the outer circumference of the magnetic body.

The magnetic bodies were housed in these housing parts, respectively. The force of pressing the magnetic body toward the bottom surface (that is, the tip of the resin springs) was varied. In this way, the relationship between the amount of the displacement of the magnetic body and the amount of the deformation of the resin springs was measured. Note that the amount of the displacement of the magnetic body is an amount of movement in a pushing direction with respect to a given position of the magnetic body. Additionally, the amount of the deformation of the resin spring is an amount of the movement of the tip of the resin spring in the pressing direction.

Figure 6:
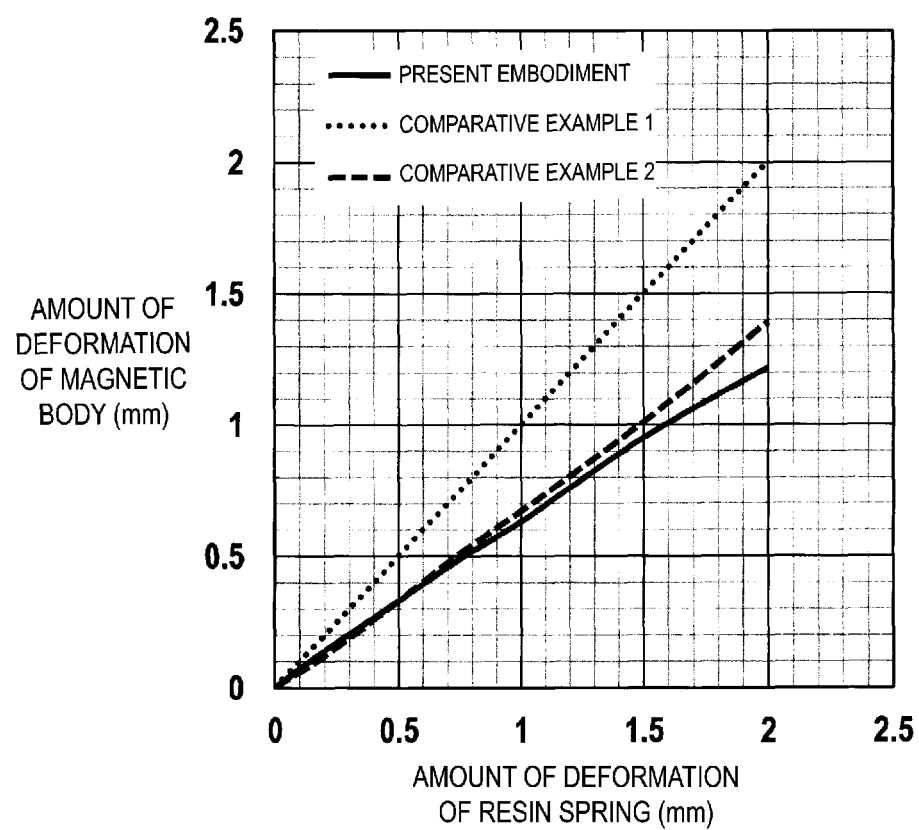
FIG. 6 is a graph showing the relationship between the amount of the displacement of a core and the amount of deformation of a resin spring.

This result is shown in the graph of FIG. 6. Note that in FIG. 6, "Comparative Example 1" refers to the resin spring of the housing part 104 illustrated in FIG. 5A, and "Comparative Example 2" refers to the resin spring of the housing part 204 illustrated in FIG. 5B.

As illustrated in FIG. 6, the resin spring of the present embodiment has a smaller amount of deformation with respect to an increase in the displacement amount of the magnetic body in comparison with the comparative examples. Additionally, with the resin spring of the present embodiment, the variation in the amount of the deformation of the resin spring (that is, the inclination of the graph) decreases as the amount of the displacement of the magnetic body increases.

Therefore, with the resin spring of the present embodiment, when the amount of pressing of the magnetic material is small, the spring is liable to be deformed, and thus the elastic support is not impaired. In contrast, when the amount of pressing of the magnetic body is large, the deformation of the spring is suppressed. Therefore, with the resin spring of the present embodiment, even in a very severe use environment in which normally vibration occurs, such as in the field of automobiles, the creep or breakage of the spring can be prevented, and stable performance can be expected.

1-2. Effects

The following advantageous effects are obtained according to the embodiment described above.

(1a) The split magnetic body 3 can be biased in the X-axis direction by the first spring 50 made of metal. The split magnetic body 3 can also be biased in the X-axis direction and the Y-axis direction by the pair of second springs 51A and 51B made of resin. Therefore, the displacement of the split magnetic body 3 in the Y-axis direction or inclination with respect to the abutting surface can be prevented.

(1b) The first spring 50 has a higher natural frequency in comparison with the pair of second springs 51A and 51B. On the other hand, in the vibration generated in the split magnetic body 3 housed in the coupled housing part 4, a vibration in the X-axis direction typically has a smaller frequency in comparison with a vibration in the Y-axis direction. Therefore, by receiving the vibration in the X-axis direction by the first spring 50 made of metal and receiving the vibration in the Y-axis direction by the second springs 51A and 51B made of resin, the resonance of the spring can be avoided, and the magnification of vibration can be suppressed.

(1c) The first spring 50 supports the split magnetic body 3 at two points, thus the split magnetic body 3 can be supported at four points in total together with the second springs 51A and 51B. As a result, holding of the split magnetic body 3 is more stabilized.

(1d) The magnetic body has a relatively large tolerance, thus also has a large variation in size. Therefore, when the size of the split magnetic body 3 is large, in a severe situation in which normally vibration occurs, the stress of the spring of the housing part increases as the amount of pressing increases, which may cause the spring to creep or break. In contrast, in the present embodiment, the ratio of the amount of the deformation of the second springs 51A and 51B with respect to the amount of pressing decreases as the amount of pressing on the second springs 51A and 51B increases. As a result, even in a severe situation in which normally vibration occurs, creep and breakage of the second springs 51A and 51B can be prevented when the amount of pressing of the split magnetic body 3 is large. On the other hand, when the amount of pressing of the split magnetic body 3 is small (for example, when the size of the split magnetic body 3 is small), a sufficient elastic deformation can be exhibited. Therefore, the degree of freedom in the size and the displacement of the split magnetic body 3 increases.

(1e) Because the housing part 4 has through holes 52A and 52B, it is possible to visually check whether the first spring 50 is disposed in the correct position after the split magnetic body 3 is housed. Thus, first spring 50 can be positioned with a relatively simple configuration. In addition, because the through holes 52A and 52B are blocked after the coupling of the housing parts 4, the first spring 50 is prevented from falling out of the through holes 52A and 52B and shorting to the circuit or the like.

(1f) The holding portion 46 enables the split magnetic body 3 to be appropriately prevented from falling out of the housing part 4 before the coupling of the housing parts 4. In addition, because the two pairs of claw portions 46A and 46B are disposed separated from each other in the Y-axis direction, the center portion in the Y-axis direction of the split magnetic body 3 is not constrained. Accordingly, when stress is applied from the electric wire, the center portion of the housing part 4 flexes, thereby preventing damage to the electric wire or the housing part 4.

(1g) The two pairs of claw portions 46A and 46B are disposed separated from each other in the Y-axis direction. Therefore, by inserting a tool between the two first claw portions 46A or the second claw portions 46B, the split magnetic body 3 can be easily removed from the housing part. Accordingly, the noise current absorber 1 can be easily disassembled.

2. Other Embodiments

Descriptions of embodiments of the present disclosure have been given above. It is to be understood that the present disclosure is not limited to these embodiments and various forms may be made.

(2a) In the noise current absorber 1 according to the above-described embodiment, it is only required that the first spring 50 is made of metal. The shape of the first spring 50 is not particularly limited. Therefore, the split magnetic body 3 need not necessarily be supported at two points. Conversely, the split magnetic body 3 may be supported at three or more points.

(2b) In the noise current absorber 1 according to the above-described embodiment, it is only required that the second springs 51A and 51B are made of resin. The shape of the second springs 51A and 51B is not particularly limited. Therefore, the second springs 51A and 51B need not necessarily have a plate-like portion that extends from the internal surface of the housing part 4 toward the bottom surface of the housing part 4. Furthermore, the tip of the plate-like portion need not be closer to the center of the housing part 4 than the internal surface of the housing part 4.

(2c) In the noise current absorber 1 according to the above-described embodiment, the pair of through holes 52A and 52B are not essentially required components. The housing part 4 may not have a pair of through holes 52A and 52B. Furthermore, the housing part 4 may have a through hole in only one of the pair of inclined walls 45A and 45B. Furthermore, the housing part 4 may be provided with a through hole through which the position of the first spring 50 can be visually recognized from the outside, on a wall other than the pair of inclined walls 45A and 45B.

(2d) In the noise current absorber 1 according to the above-described embodiment, the configuration of the holding portion 46 is not limited to that described above. Accordingly, the holding portion 46 may include only a pair of claw portions disposed in the center in the Y-axis direction, for example. Furthermore, the holding portion 46 may include a part used for the engagement other than the claw portion.

(2e) In the noise current absorber 1 according to the above-described embodiment, the magnetic body may be a perfect circle shape rather than an elliptical annular shape. Furthermore, in the case of an elliptical annular shape, the shape of the outer circumferential surface of the split magnetic body 3 can be modified as appropriate. Note that the shape of the housing part 4 can also be appropriately modified according to the external shape of the split magnetic body 3.

(2f) A plurality of functions of a single component in the embodiments described above may be distributed to a plurality of components, and functions of a plurality of components may be integrated into a single component. Parts of the configurations in the above-described embodiments may be omitted. At least part of the configuration of one the above-described embodiments may be added to or replaced with the configuration of another of the above-described embodiments. Note that all embodiments encompassed within the technical spirit defined by the language of the appended claims fall within the scope of the present disclosure.

REFERENCE SIGNS LIST

1 Noise current absorber
2A, 2B Coupling module
3 Split magnetic body
4 Housing part
31 Inner circumferential surface
32 Bottom surface
33A, 33B Abutting surface
34A, 34B Side surface
35A, 35B Split surface
36 Groove
41 Front wall
42 Rear wall
43 Bottom wall
44A, 44B Side wall
45A, 45B Inclined wall
46 Holding portion
46A, 46B Claw portion
46C Cavity
47 Drawing piece
48 Protruding portion
49 Engagement portion
50 First spring
51A, 51B Second spring
52A, 52B Through hole
53 Protrusion
56 Projection
104 Housing part 105A, 105B Resin spring
204 Housing part
205A, 205B Resin spring

The invention claimed is:

1. A noise current absorber comprising:
a pair of split magnetic bodies formed by equally splitting a magnetic body in an annular shape into an open annular shape; and
a pair of housing parts configured to house the split magnetic bodies; wherein the pair of housing parts are coupled to abut the pair of split magnetic bodies each other into the annular shape;
the pair of housing parts each include a plurality of springs configured to abut an outer circumferential surface of each of the split magnetic bodies and bias each of the split magnetic bodies in a first direction parallel to a coupling direction of the pair of housing parts; and
the plurality of springs include a first spring made of metal and a pair of second springs made of resin, the first spring being disposed in a central region of a bottom surface of the housing part facing the split magnetic bodies, the pair of second springs being disposed on both sides of the first spring in a second direction perpendicular to both the first direction and a central axis direction of an annular magnetic body formed by abutting the pair of split magnetic bodies, wherein
an abutting surface of each of the split magnetic bodies that abuts onto each of the second springs is a plane on the outer circumferential surface of each of the split magnetic bodies, the plane being inclined with respect to the first direction and the second direction, and the plane approaches the first spring as the plane approaches toward the bottom surface of the housing part;
the pair of second springs each include a plate-like portion provided protruding from an internal surface toward the bottom surface of the housing part; and
in a state in which the split magnetic bodies are not housed, a tip of the plate-like portion is closer to a center of the housing part than the internal surface.

2. The noise current absorber according to claim 1, wherein
the pair of housing parts each include a through hole through which a position of the first spring can be visually recognized from an outside before a coupling; and
the through hole is at least partially blocked by one of the second springs upon the coupling of the pair of housing parts.

3. The noise current absorber according to claim 1, wherein
the pair of housing parts each include a holding portion configured to regulate a movement of each of the split magnetic bodies in the first direction;
the holding portion includes four claw portions configured to engage with an inner circumferential surface of each of the split magnetic bodies and sandwich each of the split magnetic bodies from both sides in the central axis direction of the annular magnetic body;
two first claw portions of the four claw portions are disposed separated from each other in a circumferential direction and disposed on one side of each of the split magnetic bodies in the central axis direction of the annular magnetic body; and
two second claw portions of the four claw portions different from the first claw portions are disposed on other side of each of the split magnetic bodies in the central axis direction of the annular magnetic body while facing the two first claw portions, respectively.

4. The noise current absorber according to claim 2, wherein
the pair of housing parts each include a holding portion configured to regulate a movement of each of the split magnetic bodies in the first direction;
the holding portion includes four claw portions configured to engage with an inner circumferential surface of each of the split magnetic bodies and sandwich each of the split magnetic bodies from both sides in the central axis direction of the annular magnetic body;
two first claw portions of the four claw portions are disposed separated from each other in a circumferential direction and disposed on one side of each of the split magnetic bodies in the central axis direction of the annular magnetic body; and
two second claw portions of the four claw portions different from the first claw potions are disposed on other side of each of the split magnetic bodies in the central axis direction of the annular magnetic body while facing the two first claw portions, respectively.

5. A noise current absorber comprising:
a pair of split magnetic bodies formed by equally splitting a magnetic body in an annular shape into an open annular shape; and
a pair of housing parts configured to house the split magnetic bodies;
wherein the pair of housing parts are coupled to abut the pair of split magnetic bodies each other into the annular shape;
the pair of housing parts each include a plurality of springs configured to abut an outer circumferential surface of each of the split magnetic bodies and bias each of the split magnetic bodies in a first direction parallel to a coupling direction of the pair of housing parts; and
the plurality of springs include a first spring made of metal and a pair of second springs made of resin, the first spring being disposed in a central region of a bottom surface of the housing part facing the split magnetic bodies, the pair of second springs being disposed on both sides of the first spring in a second direction perpendicular to both the first direction and a central axis direction of an annular magnetic body formed by abutting the pair of split magnetic bodies, wherein
the pair of housing parts each include a through hole through which a position of the first spring can be visually recognized from an outside before a coupling; and
the through hole is at least partially blocked by one of the second springs upon the coupling of the pair of housing parts.

6. The noise current absorber according to claim 5, wherein
the pair of housing parts each include a holding portion configured to regulate a movement of each of the split magnetic bodies in the first direction;
the holding portion includes four claw portions configured to engage with an inner circumferential surface of each of the split magnetic bodies and sandwich each of the split magnetic bodies from both sides in the central axis direction of the annular magnetic body;
two first claw portions of the four claw portions are disposed separated from each other in a circumferential direction and disposed on one side of each of the split magnetic bodies in the central axis direction of the annular magnetic body; and two second claw portions of the four claw portions different from the first claw potions are disposed on other side of each of the split magnetic bodies in the central axis direction of the annular magnetic body while facing the two first claw portions, respectively.

\* \* \* \* \*